(12) United States Patent
Nishino et al.

(10) Patent No.: US 6,968,249 B2
(45) Date of Patent: Nov. 22, 2005

(54) CURRENT MEASURING CIRCUIT FOR MEASURING DRIVE CURRENT TO LOAD

(75) Inventors: Ko Nishino, Hyogo (JP); Seiichirou Mori, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 319 days.

(21) Appl. No.: 10/607,296

(22) Filed: Jun. 27, 2003

(65) Prior Publication Data
US 2004/0140817 A1    Jul. 22, 2004

(30) Foreign Application Priority Data
Jan. 20, 2003  (JP)  ............... 2003-010980

(51) Int. Cl.[7] ............................. G06F 19/00
(52) U.S. Cl. ............... 700/108; 323/316; 324/765
(58) Field of Search ................. 700/108, 121; 324/763, 123, 158.1; 327/538; 323/312–316

(56) References Cited

U.S. PATENT DOCUMENTS

| | | | | |
|---|---|---|---|---|
| 6,859,058 B2 * | 2/2005 | Manhaeve et al. | ......... | 324/763 |
| 2002/0158654 A1 * | 10/2002 | Graf | ............................ | 324/765 |
| 2003/0057987 A1 * | 3/2003 | Ohlhoff et al. | ............. | 324/763 |
| 2003/0071647 A1 * | 4/2003 | Schaefer et al. | ............ | 324/765 |
| 2004/0046585 A1 * | 3/2004 | Kamieniecki et al. | ...... | 324/765 |
| 2004/0232937 A1 * | 11/2004 | Ishibashi | .................... | 324/765 |

FOREIGN PATENT DOCUMENTS

JP    11-23664    1/1999

* cited by examiner

*Primary Examiner*—Zoila Cabrera
(74) *Attorney, Agent, or Firm*—McDermott Will & Emery LLP

(57) ABSTRACT

When a voltage is supplied from a voltage supply terminal to a non-inverted input terminal of an operational amplifier, a voltage equal to the supply voltage is input to an inverted input terminal and also to a voltage apply terminal for a load. When PNP transistors constituting a current mirror turn on in response to the applied voltage, a source current flows through one of the PNP transistors to the load, and a mirror current of the source current flows through the other of the PNP transistors to a current measuring terminal. The current driven to the load can be obtained by measuring the mirror current with an amperemeter.

10 Claims, 11 Drawing Sheets

CURRENT MEASURING CIRCUIT FOR MEASURING DRIVE CURRENT TO LOAD

BACKGROUND OF THE INVENTION

1. Field of the Invention

The present invention relates to current measuring circuits, and more particularly to a current measuring circuit for measuring a current driven to a load by a direct-current (DC) or alternating-current (AC) power supply.

2. Description of the Background Art

In a current measuring circuit for use in a current measuring test of an integrated circuit (IC) to be measured, various methods for high-precision measurement of a current passing through a load configured with the IC to be measured have conventionally been proposed, as described in Japanese Patent Laying-Open No. 11-23664, for example.

FIG. 18 shows a configuration of a conventional current measuring circuit proposed in Japanese Patent Laying-Open No. 11-23664.

Referring to FIG. 18, the conventional current measuring circuit includes a load 1, a voltage apply terminal 2 for applying a voltage to load 1, a voltage supply terminal 3 for supplying a first voltage V1 determining the applied voltage to load 1, an operational amplifier 4, NPN transistors Q9, Q10, resistances R1, R2, and a voltage supply current measuring terminal 5 measuring with an amperemeter 6 a current flowing when a second voltage V2 is supplied.

Load 1 is connected between voltage apply terminal 2 and a ground potential, and a current in accordance with the applied voltage of voltage apply terminal 2 is driven to load 1.

NPN transistors Q9, Q10 constitute a current mirror circuit, with a base of NPN transistor Q9 being connected to a collector of NPN transistor Q9 and a base of NPN transistor Q10. The base and the collector of NPN transistor Q9 and the base of NPN transistor Q10 are further connected to an output terminal of operational amplifier 4. A collector of NPN transistor Q10 is connected to an external power supply terminal VCC.

Resistance R1 has one end connected to an emitter of NPN transistor Q9 and the other end connected to an inverted input terminal of operational amplifier 4 and to voltage apply terminal 2 of load 1.

Resistance R2 has one end connected to an emitter of NPN transistor Q10 and the other end connected to voltage supply current measuring terminal 5. Voltage supply current measuring terminal 5 consists of amperemeter 6, and a voltage source 7 connected between amperemeter 6 and a ground potential to supply voltage V2.

In the configuration described above, when first voltage V1 supplied to voltage supply terminal 3 is input to a non-inverted input terminal of operational amplifier 4, the input voltage of the inverted input terminal can be considered to be equal to voltage V1, since operational amplifier 4 whose differential gain is sufficiently large has a difference input of approximately zero. Accordingly, voltage apply terminal 2 of load 1 connected to the inverted input terminal is applied with a voltage equal to voltage V1.

Further, a current flowing through load 1 corresponds to a current I9 which flows from the output terminal of operational amplifier 4 via NPN transistor Q9 and resistance R1 into voltage apply terminal 2. Since NPN transistors Q9 and Q10 constitute a current mirror circuit, a mirror current I10 of current I9 flowing through NPN transistor Q9 flows through NPN transistor Q10 and resistance R2.

Here, if voltage V2 of voltage source 7 is set equal to first voltage V1 at voltage supply current measuring terminal 5, current I9 of load 1 and mirror current I10 will be proportional to a ratio between reciprocals of resistances R1 and R2, which can be represented as $I10=(R1/R2) \cdot I9$. Thus, current I9 flowing through load 1 can be obtained by measuring mirror current I10 with amperemeter 6 inside voltage supply current measuring terminal 5.

As such, in the conventional current measuring circuit shown in FIG. 18, a current mirror configuration is employed, and a terminal for applying a voltage to load 1 and a terminal for measuring a current flowing through load 1 are provided separately. This ensures uninterrupted voltage supply even if a current measurement range is switched, and thus, it is possible to measure currents of various levels flowing through voltage apply terminal 2 with proper current measurement ranges, permitting high-precision measurement.

With the conventional current measuring circuit, however, current I9 of load 1 is measured on the assumption that applied voltage V1 of load 1 is equal to voltage V2 of voltage source 7 inside voltage supply current measuring terminal 5. This would cause a need to change voltage V2 of voltage source 7 when applied voltage V1 of load 1 is changed, thereby complicating the measurement.

In addition, assume that applied voltage V1 of load 1 is an alternating voltage, or load 1 is capacitive. In such a case, when a ground voltage terminal VEE of operational amplifier 4 is changed to a negative source, although it may be possible to measure a current flowing from voltage apply terminal 2 into load 1 (hereinafter, referred to as the "source current"), it would not be able to measure a current flowing out of load 1 (hereinafter, referred to as the "sink current"), since NPN transistors Q9 and Q10 turn off and cannot pass currents therethrough.

SUMMARY OF THE INVENTION

Based on the foregoing, an object of the present invention is to provide a current measuring circuit which can readily and accurately measure a current flowing through a load without adversely affecting the load.

The current measuring circuit according to the present invention is a current measuring circuit which measures a current driven to a load by an applied voltage from a voltage apply terminal. The current measuring circuit includes: an operational amplifier having its second input terminal connected with the voltage apply terminal for applying a voltage equal to a voltage supplied to its first input terminal to the load; a PNP type first transistor electrically coupled between an output terminal of the operational amplifier and the voltage apply terminal; and a PNP type second transistor electrically coupled between the output terminal of the operational amplifier and a current measuring terminal and constituting a current mirror with the PNP type first transistor. The PNP type first and second transistors have their bases connected to the second input terminal of the operational amplifier and to the voltage apply terminal, and, when activated in response to the applied voltage, the PNP type first transistor drives a current to the load via the voltage apply terminal, and the PNP type second transistor drives a mirror current of the drive current of the PNP type first transistor to the current measuring terminal.

As such, according to the current measuring circuit of the present invention, it is possible to readily and accurately measure a current flowing through a load without adversely affecting the load, with a simple configuration based on a current mirror circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
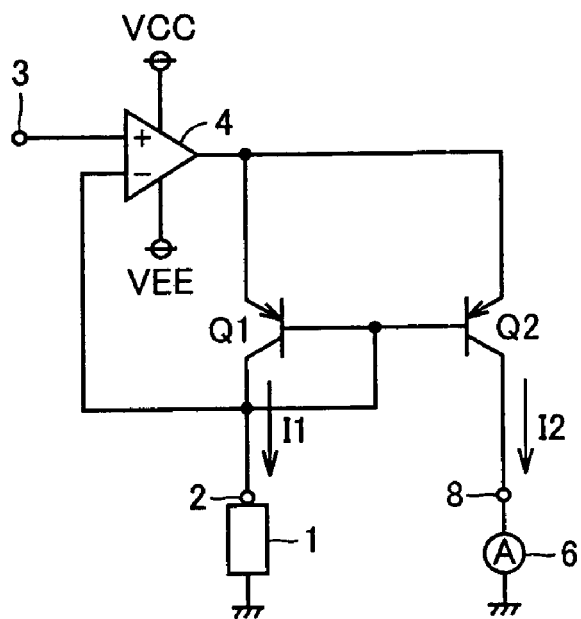
FIG. 1 shows a configuration of the current measuring circuit according to a first embodiment of the present invention.

Hereinafter, embodiments of the present invention will be described with reference to the drawings. In the drawings, the same or corresponding portions are denoted by the same reference characters.

First Embodiment

Referring to FIG. 1, the current measuring circuit according to the first embodiment of the present invention includes a load 1, a voltage apply terminal 2 for applying a voltage to load 1, a voltage supply terminal 3 for supplying a voltage determining the applied voltage of load 1, an operational amplifier 4, PNP transistors Q1, Q2, a current measuring terminal 8, and an amperemeter 6.

Figure 18:
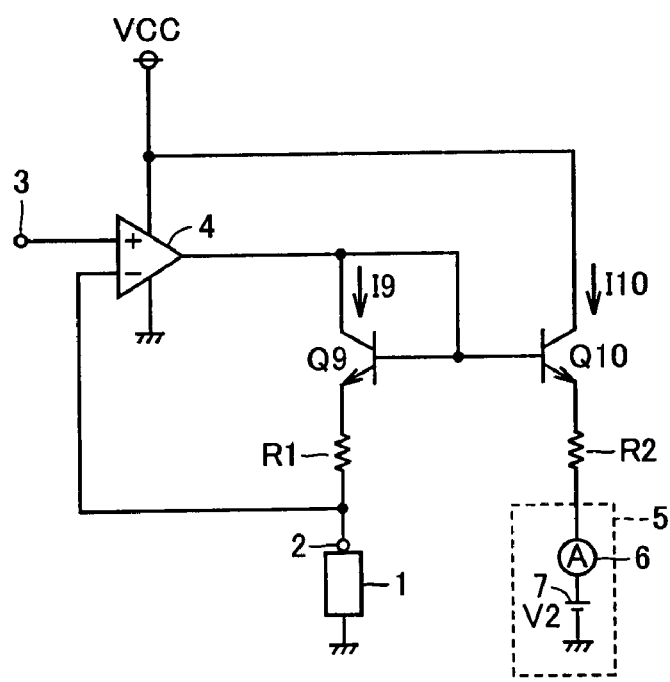
FIG. 18 shows an example of the configuration of a conventional current measuring circuit.

The current measuring circuit of the present embodiment differs from the conventional current measuring circuit shown in FIG. 18 in that NPN transistors Q9, Q10 are replaced with PNP transistors Q1, Q2 constituting a current mirror circuit, and that resistances R1, R2 and voltage source 7 are eliminated. Description of the common portions is not repeated here. It is noted that voltage supply current measuring terminal 5 of the current measuring circuit in FIG. 18 is replaced with current measuring terminal 8, since voltage source 7 has been eliminated.

Load 1, connected between voltage apply terminal 2 and a ground potential, is formed of an IC to be measured.

PNP transistors Q1, Q2 constitute a current mirror circuit, with a base of PNP transistor Q1 connected to a collector of PNP transistor Q1 and a base of PNP transistor Q2. A connect node of the base and the collector of PNP transistor Q1 and the base of PNP transistor Q2 is connected to an inverted input terminal of operational amplifier 4. Emitters of PNP transistors Q1, Q2 are both connected to an output terminal of operational amplifier 4.

The collector of PNP transistor Q1 is connected to voltage apply terminal 2 and to the inverted input terminal of operational amplifier 4, whereas a collector of PNP transistor Q2 is connected to amperemeter 6 provided between current measuring terminal 8 and a ground potential.

In the configuration of FIG. 1, the difference input of operational amplifier 4 can be regarded as zero. Thus, a voltage equal to the voltage supplied from voltage supply terminal 3 to a non-inverted input terminal of operational amplifier 4 is input to the inverted input terminal and to voltage apply terminal 2. That is, the applied voltage to load 1 is determined by the voltage of voltage supply terminal 3.

Next, when the applied voltage is input to the bases of PNP transistors Q1, Q2, PNP transistors Q1, Q2 both turn on. Thus, a source current I1 flows through PNP transistor Q1 to load 1, and a mirror current I2 of source current I1 flows through PNP transistor Q2 to current measuring terminal 8. Here, mirror current I2 has its magnitude determined according to the transistor sizes of PNP transistors Q1, Q2 constituting the current mirror circuit, and thus, it can be made equal to source current I1 by making the two transistors equal in size.

Accordingly, current I1 flowing through load 1 can be obtained by measuring mirror current I2 with amperemeter 6.

Modification

Figure 2:
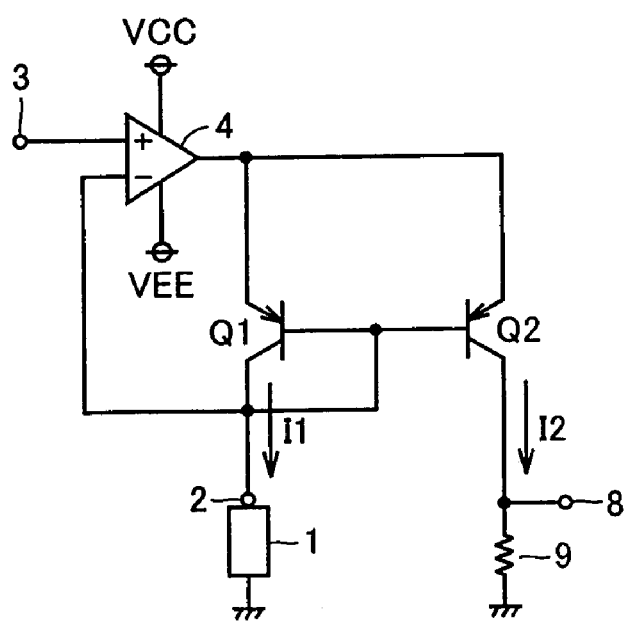
FIG. 2 shows a configuration of the current measuring circuit according to a modification of the first embodiment.

Referring to FIG. 2, the current measuring circuit according to the modification of the first embodiment is identical to that of the first embodiment in FIG. 1 except that amperemeter 6 is replaced with a current/voltage converting resistance 9 connected between current measuring terminal 8 and a ground potential, and thus, description of the common portions is not repeated here.

In this configuration, mirror current I2 flowing through PNP transistor Q2 is obtained by measuring a voltage between current measuring terminal 8 and a ground potential and by obtaining a quotient when the measured voltage value is divided by a resistance value of resistance 9. Current I1 of load 1 can readily be obtained, since it is equal to the quotient.

An oscilloscope (not shown) may be connected between current measuring terminal 8 and a ground potential to monitor a current waveform therebetween, to thereby obtain a waveform of current I1 flowing through load 1.

As described above, according to the current measuring circuit of the first embodiment of the present invention, a current flowing through a load can readily be obtained by measuring a mirror current of a PNP transistor constituting a current mirror circuit. This permits simpler measurement of the load current, since it is unnecessary to follow a change of applied voltage to supply the same voltage to a voltage source as in the case of the conventional current measuring circuit.

In addition, since the mirror current of the PNP transistor is a collector output, it is unnecessary to provide a resistance and a voltage source between a measuring terminal and a ground potential as in the conventional current measuring circuit. This can reduce the parts count compared to the conventional one, which leads to downsizing of the circuit scale and is also advantageous in terms of cost.

Second Embodiment

Figure 3:
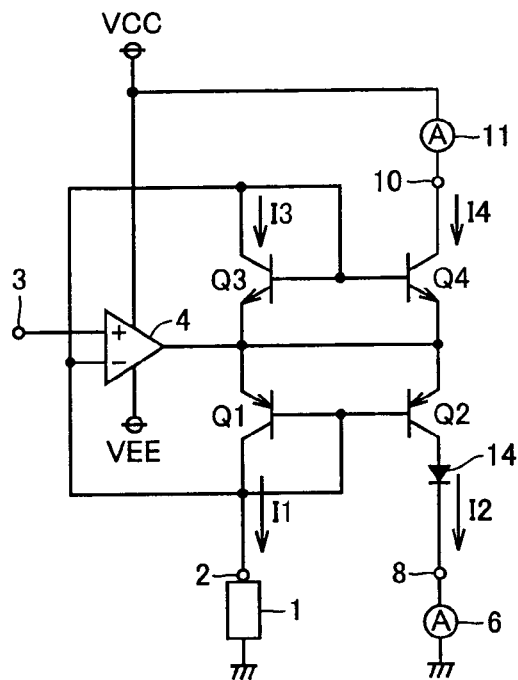
FIG. 3 shows a configuration of the current measuring circuit according to a second embodiment of the present invention.

Referring to FIG. 3, the current measuring circuit according to the second embodiment of the present invention includes a load 1, a voltage apply terminal 2, a voltage supply terminal 3, an operational amplifier 4, PNP transistors Q1, Q2, NPN transistors Q3, Q4, amperemeters 6, 11, and a diode 14.

The current measuring circuit of the present embodiment is identical to that of the first embodiment shown in FIG. 1 except that NPN transistors Q3, Q4, amperemeter 11 and diode 14 are additionally provided, and thus, description of the common portions is not repeated here.

NPN transistors Q3, Q4 have their emitters connected to the output terminal of operational amplifier 4. NPN transistor Q3 has its base connected to a collector of NPN transistor Q3 and a base of NPN transistor Q4, and constitutes a current mirror circuit together with NPN transistor Q4. The base and the collector of NPN transistor Q3 and the base of NPN transistor Q4 are also connected to the inverted input terminal of operational amplifier 4. Amperemeter 11 is connected between a collector of NPN transistor Q4 and an external power supply terminal VCC via current measuring terminal 10, which can measure a current I4 flowing through NPN transistor Q4.

Diode 14 has its cathode connected to current measuring terminal 8 and its anode connected to the collector of PNP transistor Q2. This is for preventing a current flow from a ground potential via amperemeter 6 to the collector of PNP transistor Q2 and further from the collector to the base.

In the configuration described above, when a positive voltage is supplied to voltage supply terminal 3, the positive voltage is applied from voltage apply terminal 2 to load 1. In this case, source current I1 of load 1 can be obtained by monitoring with amperemeter 6 mirror current I2 flowing through PNP transistor Q2 in PNP transistors Q1, Q2 constituting the current mirror circuit, as described in the first embodiment.

By comparison, when a negative voltage is supplied to voltage supply terminal 3, the negative voltage is applied from voltage apply terminal 2 to load 1. In response, a sink current flows out of load 1. The current amount of load 1, however, cannot be obtained with amperemeter 6, since PNP transistors Q1, Q2 are not turned on with their base-emitter voltages reverse-biased.

Thus, in this case, NPN transistors Q3, Q4 similarly constituting a current mirror circuit are used to obtain the sink current of load 1. More specifically, when NPN transistors Q3, Q4 are turned on with their base-emitter voltages being forward-biased by application of the negative voltage, a mirror current I4 equal to the sink current I3 of load 1 flowing through NPN transistor Q3 flows through NPN transistor Q4. Thus, the sink current of load 1 can be obtained by monitoring this mirror current I4 with amperemeter 11.

As such, the configuration shown in FIG. 3 provided with the current mirror circuits driven by positive and negative voltages, respectively, allows a current of load 1 to be obtained readily and accurately at the time of application of alternating voltage.

In addition, even if the applied voltage to load 1 is solely positive, in the case where the voltage changes between a high potential and a low potential, the change of the applied voltage from a high potential to a low potential will cause a sink current to flow out of load 1 as a discharge current if load 1 is capacitive. In the current measuring circuit having the configuration shown in FIG. 3, however, such a sink current would not flow through PNP transistors Q1, Q2, but through NPN transistors Q3, Q4. Thus, the sink current can readily be obtained by monitoring the same with amperemeter 11.

Modification

Figure 4:
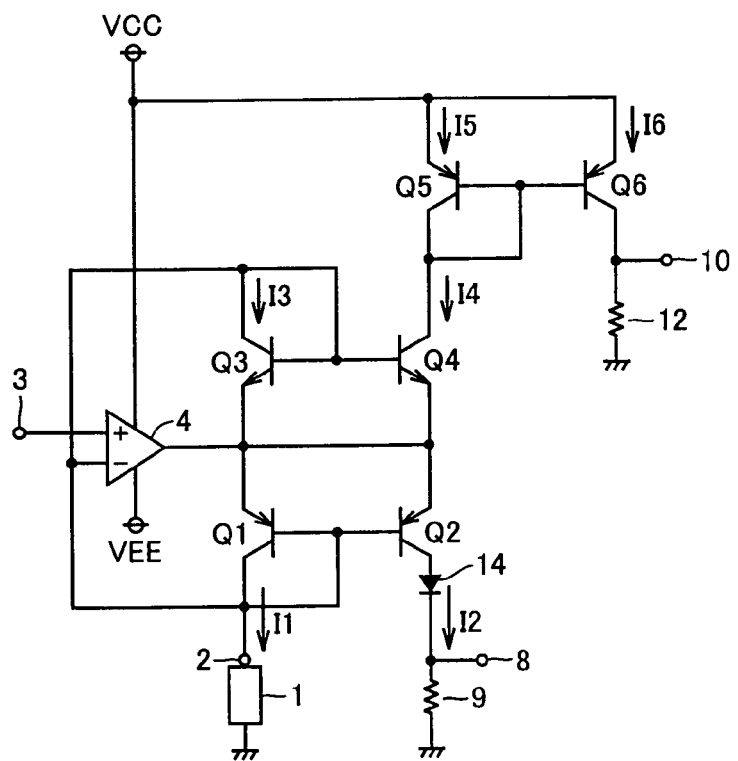
FIG. 4 shows a configuration of the current measuring circuit according to a modification of the second embodiment.

Referring to FIG. 4, the current measuring circuit according to the modification of the second embodiment differs from that of the second embodiment shown in FIG. 3 in that amperemeter 11 connected to the collector of NPN transistor Q4 via current measuring terminal 10 is replaced with PNP transistors Q5, Q6 constituting a current mirror circuit, that a current/voltage converting resistance 12 is additionally provided between current measuring terminal 10 and a ground potential, and that amperemeter 6 connected to the collector of PNP transistor Q2 via current measuring terminal 8 is replaced with a current/voltage converting resistance 9. Description of the common portions is not repeated here.

PNP transistors Q5, Q6 constitute a current mirror circuit, with a base of PNP transistor Q5 being connected to a collector of PNP transistor Q5 and a base of PNP transistor Q6. The collector of PNP transistor Q5 is further connected to the collector of NPN transistor Q4. PNP transistors Q5, Q6 have their emitters both connected to external power supply terminal VCC.

In the above configuration, when a voltage being supplied from voltage supply terminal 3 to the non-inverted input terminal of operational amplifier 4 is a positive voltage, mirror current I2 equal to source current I1 flowing from PNP transistor Q1 to load 1 flows through PNP transistor Q2 to resistance 9, as in the modification of the first embodiment shown in FIG. 2. Thus, mirror current I2, and hence source current I1 of load 1, can be obtained from a voltage between current measuring terminal 8 and a ground potential and from the resistance value of resistance 9.

By comparison, when the voltage being supplied to voltage supply terminal 3 is a negative voltage, sink current I3 from load 1 will flow through NPN transistor Q3, and correspondingly, a mirror current I4 equal thereto will flow through NPN transistor Q4 constituting the current mirror pair, as in the second embodiment of FIG. 3. Further, mirror current I4 flowing through NPN transistor Q4 corresponds to a current I5 flowing through PNP transistor Q5. Thus, a current I6 equal to mirror current I4 flows through PNP transistor Q6 constituting the current mirror pair with PNP transistor Q5, and to resistance 12. That is, current I6 equal to sink current I3 of load 1 flowing through NPN transistor Q3 comes to flow through PNP transistor Q6 to resistance 12, so that it is possible to obtain the sink current by measuring current I6.

An oscilloscope (not shown) may be provided between current measuring terminal 10 and a ground potential to monitor a current waveform of the sink current.

Figure 5:
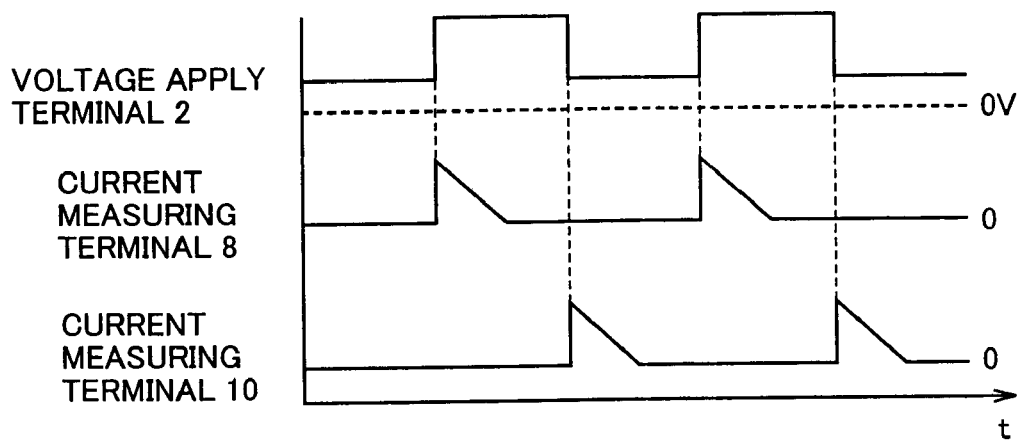
FIG. 5 shows waveforms of the load current measured in the current measuring circuit shown in FIG. 4.

FIG. 5 shows current waveforms monitored by oscilloscopes provided between current measuring terminals 8, 10 and a ground potential in accordance with a voltage change of voltage supply terminal 3 when load 1 is capacitive.

As shown in FIG. 5, the voltage waveform of voltage apply terminal 2 makes transitions between a high potential and a low potential in accordance with a voltage supplied to voltage supply terminal 3. In response, in the current waveform monitored at current measuring terminal 8, a source current is detected for a prescribed time period in response to the supplied voltage attaining a high potential. By comparison, in the current waveform monitored at current measuring terminal 10, a sink current is detected as load 1 is discharged in response to the supplied voltage attaining a low potential. As such, the source current and the sink current flowing through load 1 can be measured distinctively from each other.

As described above, according to the second embodiment of the present invention, current characteristics of the load at the time of application of alternating voltage can readily be obtained by a current measuring circuit of a simple configuration provided with current mirror circuits driven by positive and negative voltages, respectively.

In addition, the current characteristics when the alternating voltage is applied and when the load is capacitive can be obtained by distinctively measuring a source current and a sink current flowing through the load.

Third Embodiment

Figure 6:
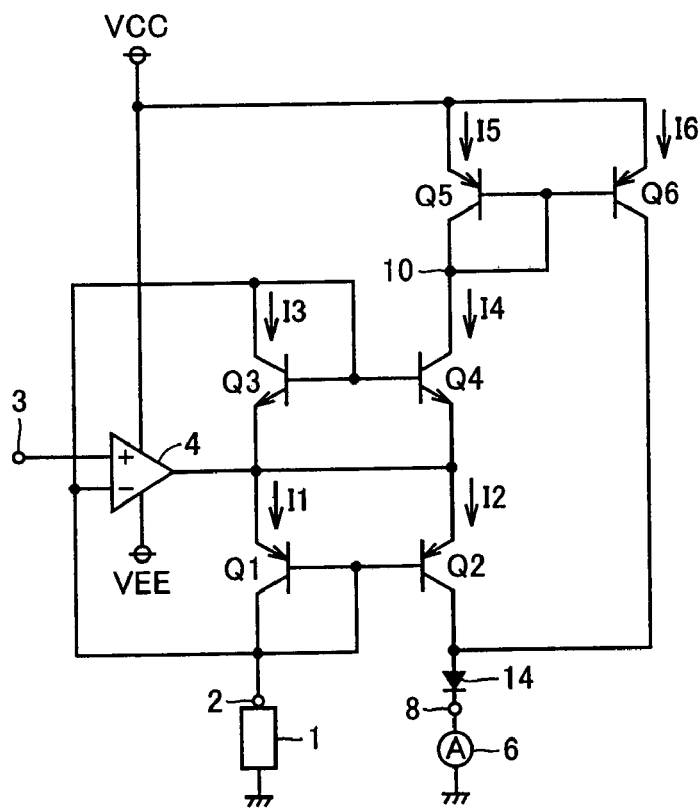
FIG. 6 shows a configuration of the current measuring circuit according to a third embodiment of the present invention.

Referring to FIG. 6, the current measuring circuit according to the third embodiment of the present invention is identical to that of the modification of the second embodiment shown in FIG. 4 except that, of PNP transistors Q5, Q6 constituting the current mirror circuit, the collector of PNP transistor Q6 is connected to current measuring terminal 8, and thus, description of the common portions is not repeated here.

In this configuration, when a positive voltage is supplied to voltage supply terminal 3, mirror current I2 of source current I1 flowing through PNP transistor Q1 to load 1 flows through PNP transistor Q2 constituting the current mirror pair to current measuring terminal 8, as in the second embodiment shown in FIGS. 3, 4. Thus, amperemeter 6 can be used to monitor mirror current I2 to thereby obtain source current I1 of load 1.

By comparison, when a negative voltage is supplied to voltage supply terminal 3, when sink current I3 flowing out of load 1 flows through NPN transistor Q3, mirror current I4 equal to sink current I3 flows through NPN transistor Q4 constituting the current mirror pair, as in the modification of the second embodiment of FIG. 4. Further, mirror current I4 flowing through NPN transistor Q4 corresponds to a current I5 flowing through PNP transistor Q5, so that a mirror current I6 of current I5 flows through PNP transistor Q6. That is, a current equal to sink current I3 of load 1 flows through PNP transistor Q6. Further, the current I6 flows through current measuring terminal 8 to amperemeter 6. Thus, sink current I3 can be obtained by monitoring the same with amperemeter 6.

In the current measuring circuit of the present embodiment, the source current and the sink current both flow through amperemeter 6. Thus, the current obtained by the monitoring with amperemeter 6 is a sum of absolute values of source current and sink current of load 1.

Modification

Figure 7:
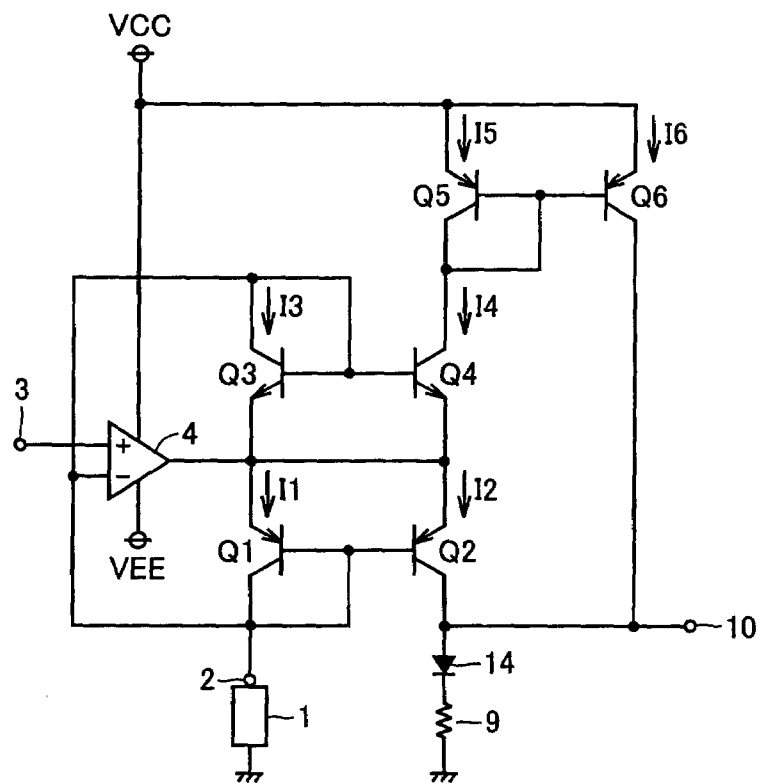
FIG. 7 shows a configuration of the current measuring circuit according to a modification of the third embodiment.

Referring to FIG. 7, the current measuring circuit according to the modification of the third embodiment is identical to that of the third embodiment shown in FIG. 6 except that amperemeter 6 is replaced with a current/voltage converting resistance 9, and thus, description of the common portions is not repeated here.

With the configuration shown in FIG. 7, mirror current I2 of source current I1 from PNP transistor Q2 flows into resistance 9, and current I6 equal to sink current I3 from NPN transistor Q6 also flows into resistance 9.

Thus, the current of load 1 can be obtained from the voltage of current measuring terminal 10 and the resistance value of resistance 9. The current value obtained corresponds to a sum of absolute values of source current and sink current of load 1.

As described above, according to the third embodiment of the present invention, when the applied voltage to the load is an alternating voltage, or when the load is capacitive, it is possible to readily and accurately obtain a sum of absolute values of the source current and the sink current flowing through the load.

Fourth Embodiment

Figure 8:
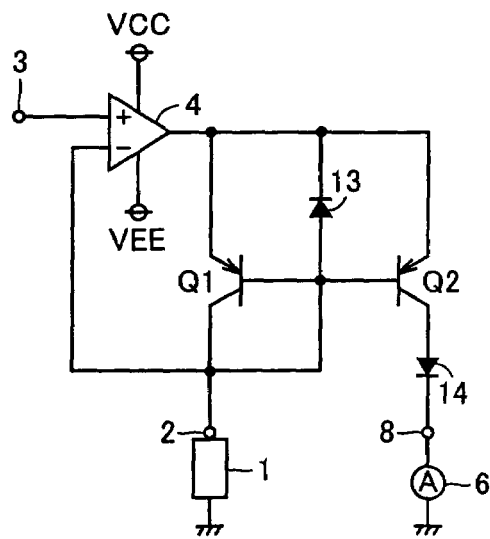
FIG. 8 shows a configuration of the current measuring circuit according to a fourth embodiment of the present invention.

Referring to FIG. 8, the current measuring circuit according to the fourth embodiment of the present invention differs from that of the first embodiment shown in FIG. 1 in that a diode 13 connected between the bases of PNP transistors Q1, Q2 constituting the current mirror circuit and the output terminal of operational amplifier 4 and a diode 14 connected between the collector of PNP transistor Q2 and current measuring terminal 8 are additionally provided. Description of the common portions is not repeated here.

Diode 13 has its cathode connected to the output terminal of operational amplifier 4, and its anode connected to the bases of PNP transistors Q1, Q2. Thus, when the voltage being supplied to voltage supply terminal 3 becomes a negative voltage, the sink current flowing out of load 1 through voltage apply terminal 2 comes to flow to the output terminal of operational amplifier 4, with a sink current path formed.

Diode 14 has its cathode connected to current measuring terminal 8 and its anode connected to the collector of PNP transistor Q2. This is for preventing a current flow from a ground voltage via amperemeter 6 to the collector of PNP transistor Q2 and further from the collector to the base.

With this configuration, when it is unnecessary to measure the sink current of load 1, it is possible to readily measure solely the source current by providing only diodes 13 and 14, without provision of NPN transistors Q3, Q4 and PNP transistors Q5, Q6 as shown, e.g., in FIGS. 3 and 4.

Modification

Figure 9:
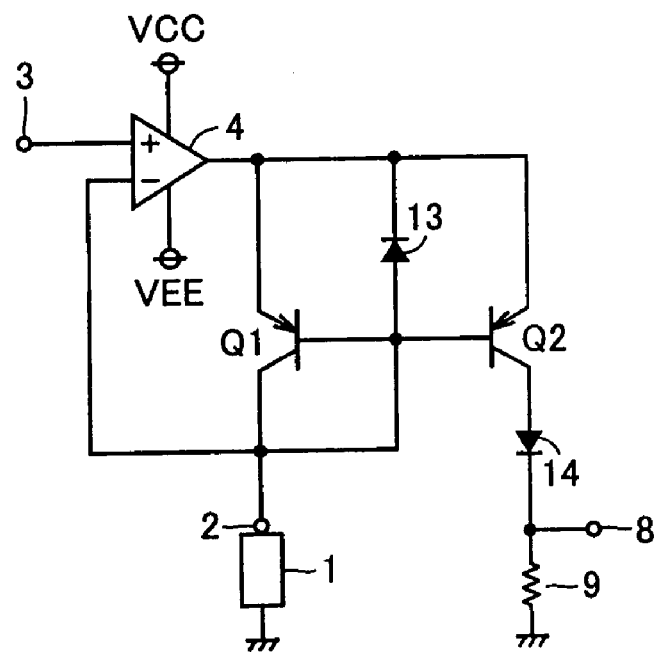
FIG. 9 shows a configuration of the current measuring circuit according to a modification of the fourth embodiment.

Referring to FIG. 9, the current measuring circuit according to the modification of the fourth embodiment is identical to that of the fourth embodiment shown in FIG. 8 except that amperemeter 6 is replaced with a current/voltage converting resistance 9, and thus, description of the common portions is not repeated here.

In this configuration, again, provision of diodes 13, 14 facilitates measurement of solely a source current flowing through load 1. The source current can readily be measured from a voltage between current measuring terminal 8 and a ground potential and a resistance value of resistance 9, as in the modification of the first embodiment shown in FIG. 2.

As described above, according to the fourth embodiment of the present invention, even when an alternating voltage is applied to a load or when the load is capacitive, solely a source current flowing through the load can readily be obtained by the current measuring circuit of simple configuration.

Fifth Embodiment

Figure 10:
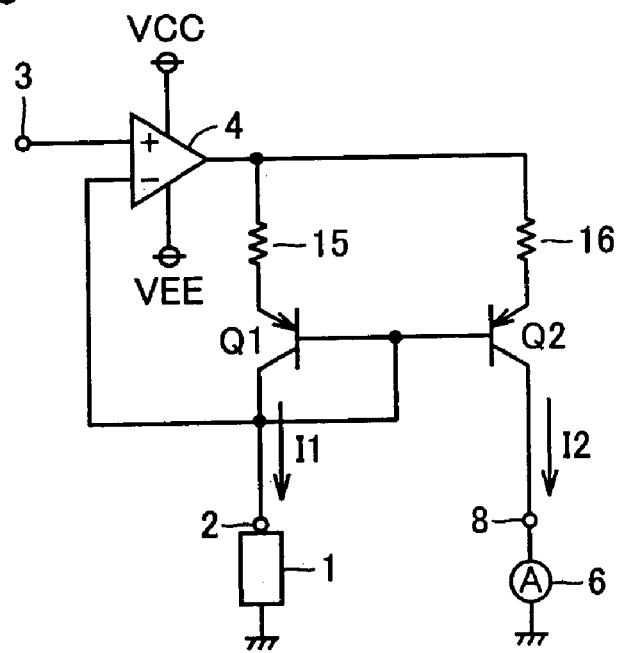
FIG. 10 shows a configuration of the current measuring circuit according to a fifth embodiment of the present invention.

Referring to FIG. 10, the current measuring circuit according to the fifth embodiment of the present invention is identical to that of the first embodiment shown in FIG. 1 except that resistances 15, 16 are additionally inserted between the emitters of PNP transistors Q1, Q2 constituting the current mirror circuit and the output terminal of operational amplifier 4, and thus, description of the common portions is not repeated here.

Making PNP transistors Q1, Q2 constituting the current mirror circuit equal in size allows mirror current I2 equal to current I1 of PNP transistor Q1 to flow through PNP transistor Q2. However, the base-emitter voltages of PNP transistors Q1, Q2 are not necessarily equal in potential, due to variation in process or the like. This may cause a mismatch between collector currents of PNP transistors Q1 and Q2, hindering accurate measurement of a current of load 1.

Thus, as shown in FIG. 10, resistances 15 and 16 are provided between the output terminal of operational amplifier 4 and the emitters of PNP transistors Q1 and Q2, respectively, and their resistance values are set such that voltage drops due to these resistances are non-negligible. Accordingly, it is possible to lessen the difference of collector currents due to the difference of base-emitter voltages.

Modification

Figure 11:
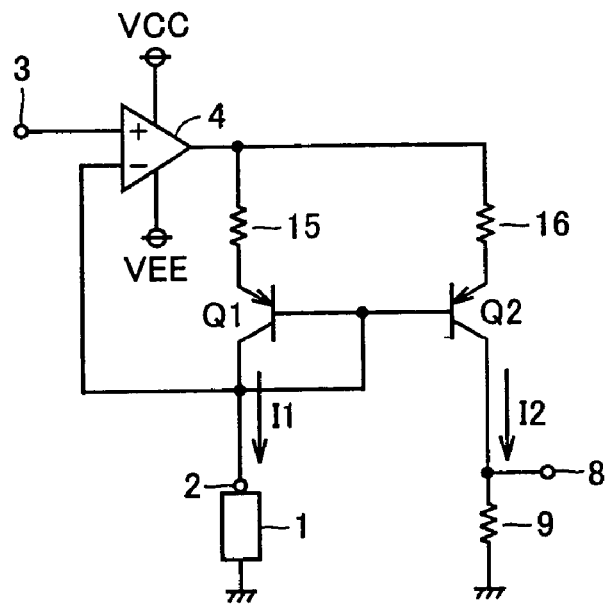
FIG. 11 shows a configuration of the current measuring circuit according to a modification of the fifth embodiment.

Referring to FIG. 11, the current measuring circuit according to the modification of the fifth embodiment is identical to that of the fifth embodiment shown in FIG. 10 except that amperemeter 6 is replaced with a current/voltage converting resistance 9, and thus, description of the common portions is not repeated here.

In this configuration, again, resistances 15, 16 connected between PNP transistors Q1, Q2 and operational amplifier 4 lessen the difference of the currents flowing through PNP transistors Q1, Q2 and thus permit accurate measurement of source current I1 of load 1. Source current I1 can readily be measured from the voltage between current measuring terminal 8 and a ground potential and the resistance value of resistance 9.

As described above, according to the fifth embodiment of the present invention, the difference in collector current due to the difference in base-emitter voltage between the transistors constituting a current mirror circuit can be lessened, and therefore, the current characteristics of the load can be measured more accurately.

Sixth Embodiment

Figure 12:
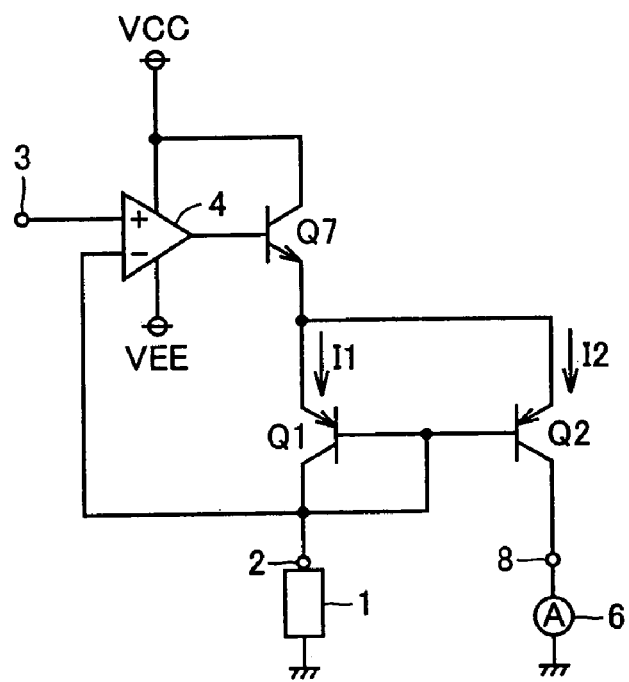
FIG. 12 shows a configuration of the current measuring circuit according to a sixth embodiment of the present invention.

Referring to FIG. 12, the current measuring circuit according to the sixth embodiment of the present invention is identical to that of the first embodiment shown in FIG. 1 except that an NPN transistor Q7 is additionally provided between the output terminal of operational amplifier 4 and the emitters of PNP transistors Q1, Q2, and thus, description of the common portions is not repeated here.

NPN transistor Q7 has its base connected to the output terminal of operational amplifier 4, its collector connected to external power supply voltage VCC and its emitter connected to the emitters of PNP transistors Q1, Q2. In this configuration, NPN transistor Q7 functions as an emitter follower which, in receipt of an output of operational amplifier 4 at its base, amplifies a current driven to the current mirror circuit connected to its emitter.

That is, since the emitter follower has high current driving capability, the output current of operational amplifier 4 flows through PNP transistor Q1 after being current amplified by NPN transistor Q7 as the emitter follower, and mirror current I2 equal to the amplified current flows through PNP transistor Q2 constituting the current mirror pair. Thus, the source current of load 1 can be obtained by measuring mirror current I2 at amperemeter 6. This is advantageous in the case where operational amplifier 4 has low current driving capability with respect to source current I1 of load 1.

First Modification

Figure 13:
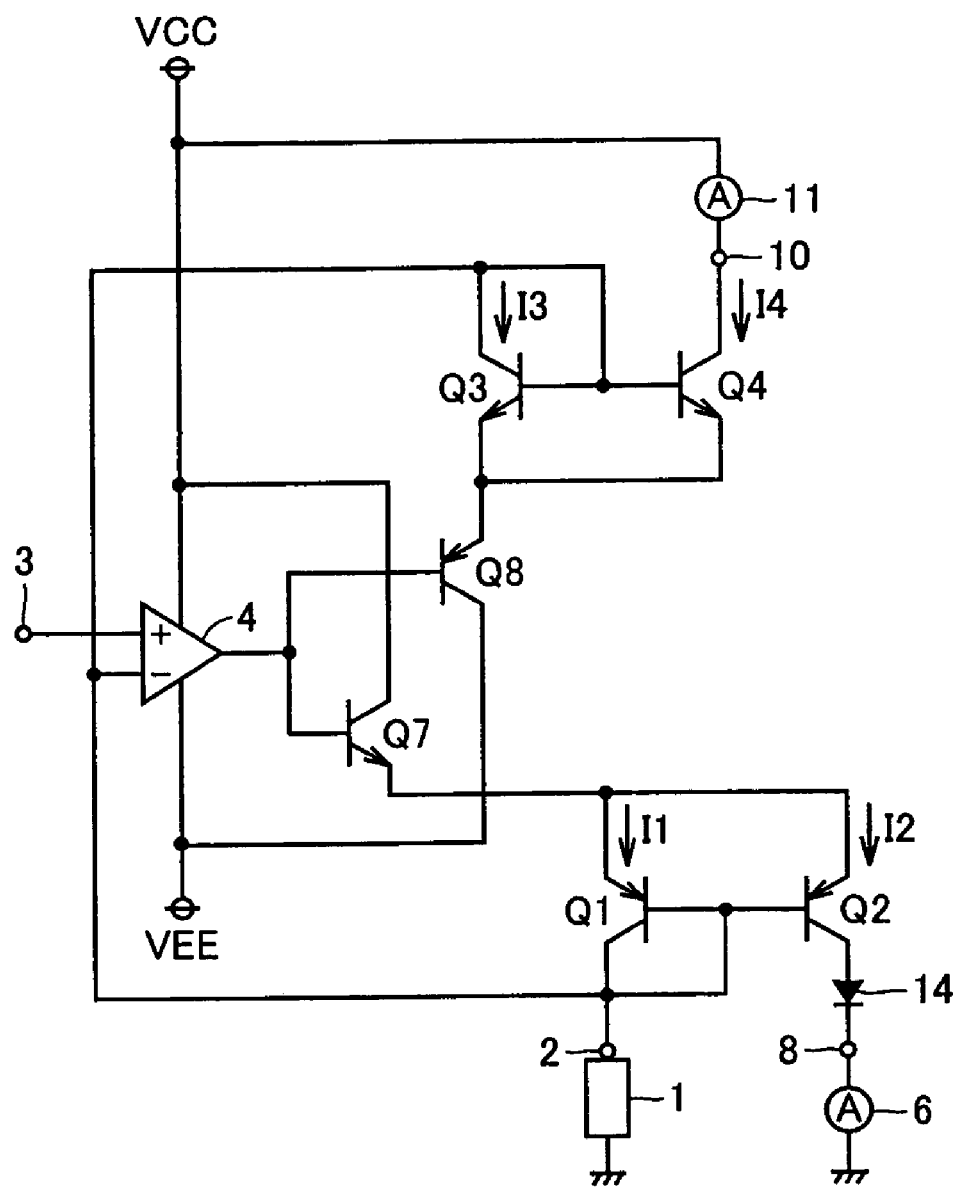
FIGS. 13–16 show configurations of the current measuring circuits according to first through fourth modifications of the sixth embodiment.

Referring to FIG. 13, the current measuring circuit according to the first modification of the sixth embodiment is identical to that of the sixth embodiment shown in FIG. 12 except that NPN transistors Q3, Q4 and an amperemeter 11 for measuring the sink current of load 1, and a PNP transistor Q8 as an emitter follower connected between the emitters of NPN transistors Q3, Q4 and operational amplifier 4 are additionally provided. Thus, description of the common portions is not repeated here.

In this configuration, NPN transistors Q3, Q4 constituting the current mirror circuit, and amperemeter 11 connected between the collector of NPN transistor Q4 and external power supply terminal VCC have the same configurations as those in the current measuring circuit of the second embodiment shown in FIG. 3. When sink current I3 from load 1 flows through NPN transistor Q3, mirror current I4 equal thereto flows through NPN transistors Q4. The sink current can be obtained by measuring the current value of mirror current I4 by amperemeter 11.

In the present embodiment, PNP transistor Q8 as the emitter follower is further inserted between the emitters of NPN transistors Q3, Q4 and the output terminal of operational amplifier 4. Thus, even if operational amplifier 4 has current driving capability that is lower than that of load 1, the current is amplified by PNP transistor Q8, so that the sink current of load 1 can be measured accurately.

Second Modification

Figure 14:
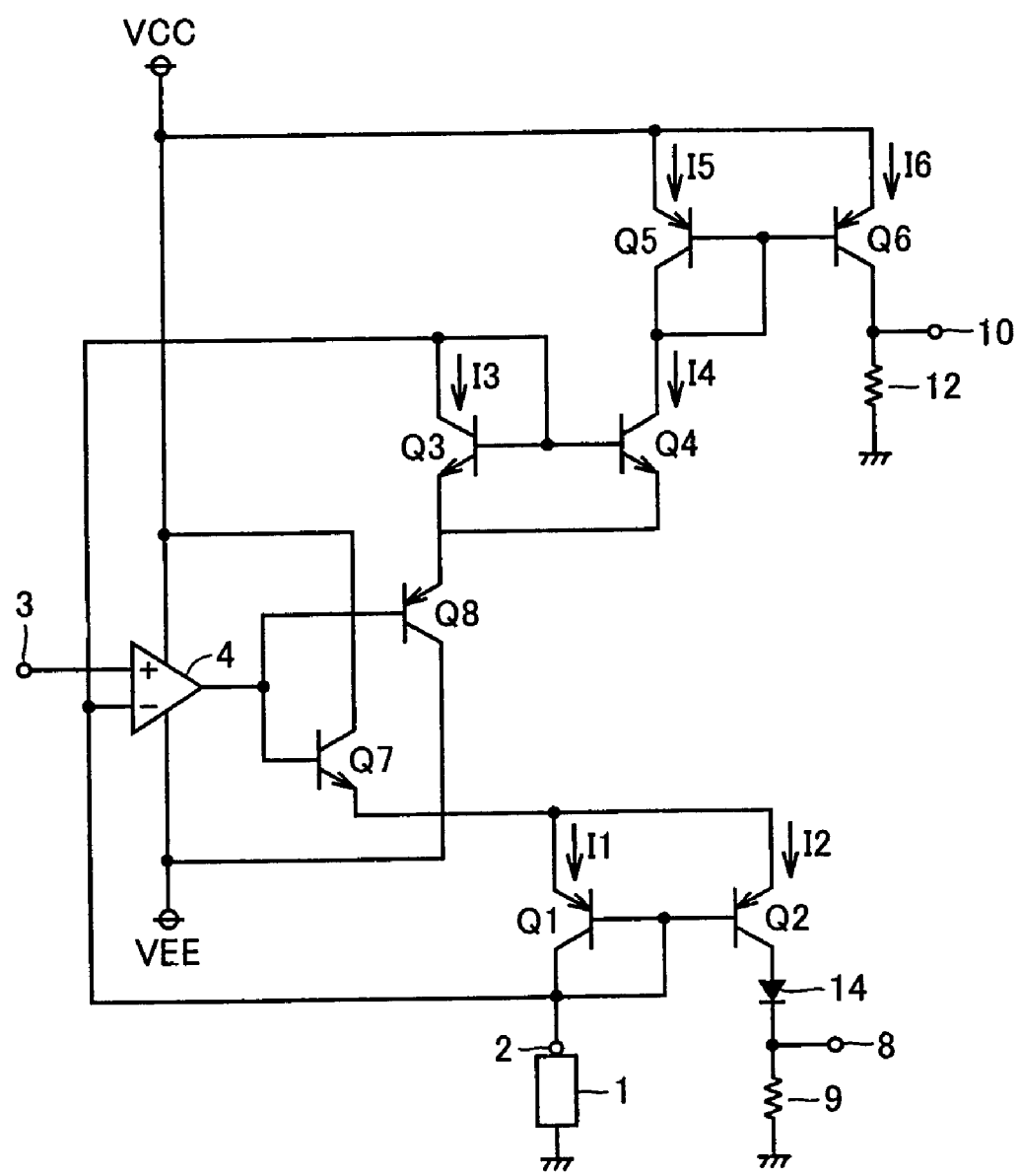

Referring to FIG. 14, the current measuring circuit according to the second modification of the sixth embodiment is identical to that of the first modification of the sixth embodiment shown in FIG. 13 except that amperemeters 6, 11 are replaced with current/voltage converting resistances 9, 12, respectively. Description of the common portions is not repeated here. For resistance 12, PNP transistors Q5, Q6 are provided to cause the mirror current flowing through NPN transistor Q4 to further flow through resistance 12 to a ground potential. Detailed configuration thereof is identical to those in the modification of the second embodiment shown in FIG. 4.

In the current measuring circuit of the present embodiment, again, NPN transistor Q7 and PNP transistor Q8 as emitter followers are connected between the emitters of PNP transistors Q1, Q2 and the output terminal of operational amplifier 4 and between the emitters of NPN transistors Q3, Q4 and the output terminal of operational amplifier 4, respectively. They amplify the output current of operational amplifier 4 when the current driving capability of operational amplifier 4 is inferior to that of load 1.

As such, mirror current I2 amplified by the emitter follower flows through PNP transistor Q2. This current amount can readily be obtained from the voltage between current measuring terminal 8 and the ground potential and the resistance value of resistance 9.

Similarly, current I6 equal to sink current I3 amplified by the emitter follower flows through PNP transistor Q6. This current amount can also be obtained from the voltage between current measuring terminal 10 and the ground potential and the resistance value of resistance 12.

Third Modification

Figure 15:
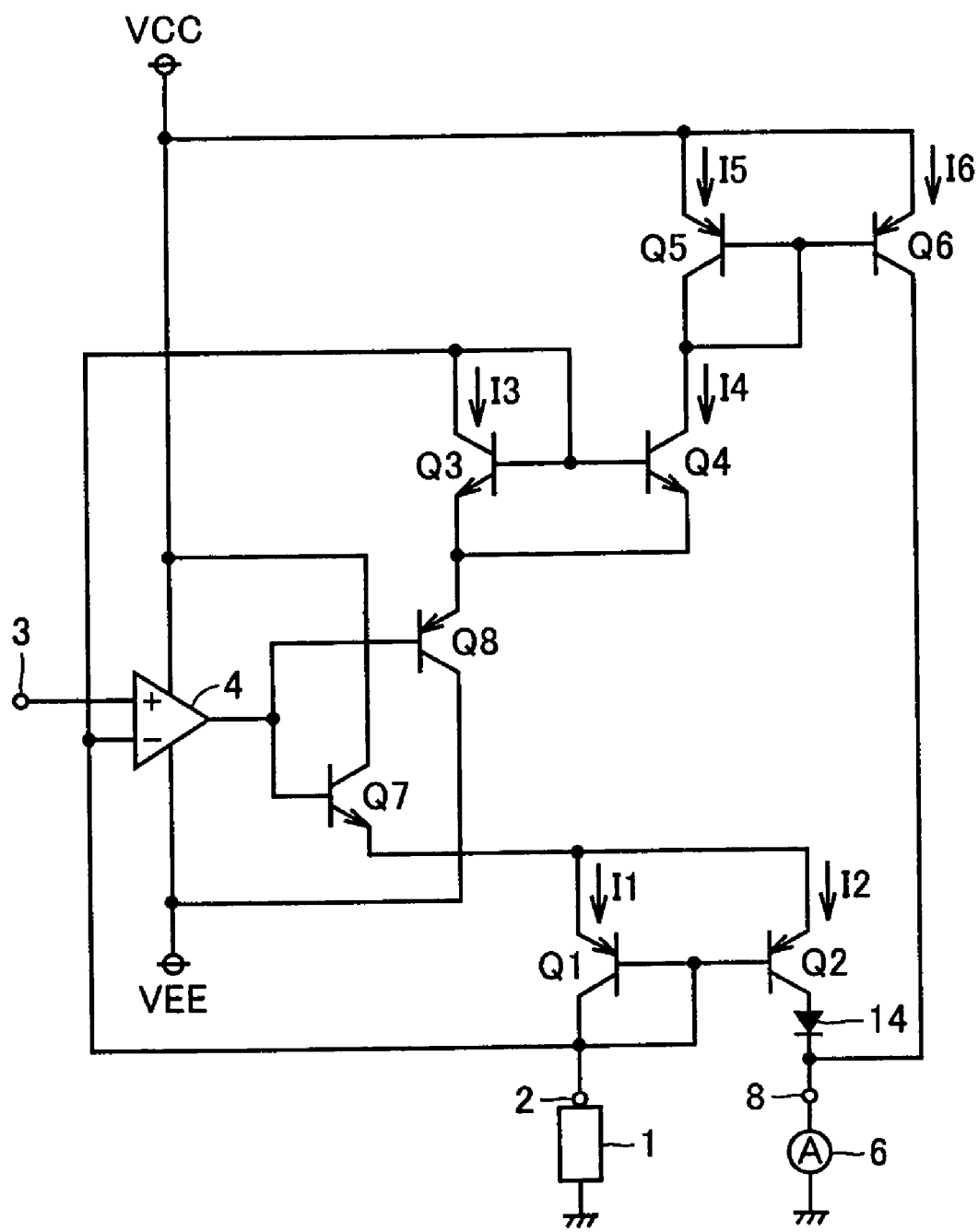

Referring to FIG. 15, the current measuring circuit according to the third modification of the sixth embodiment is identical to that of the second modification of the sixth embodiment shown in FIG. 14 except that the collector of PNP transistor Q6 is connected to current measuring terminal 8, and thus, description of the common portions is not repeated here.

With this configuration, a current equal to the sink current of load 1 amplified by the emitter follower flows through PNP transistor Q6 and further flows via current measuring terminal 8 to amperemeter 6. To amperemeter 6, a current equal to the source current also flows from PNP transistor Q2. Thus, it is possible to measure a current corresponding to a sum of absolute values of the source current and the sink current of load 1.

Fourth Modification

Figure 16:
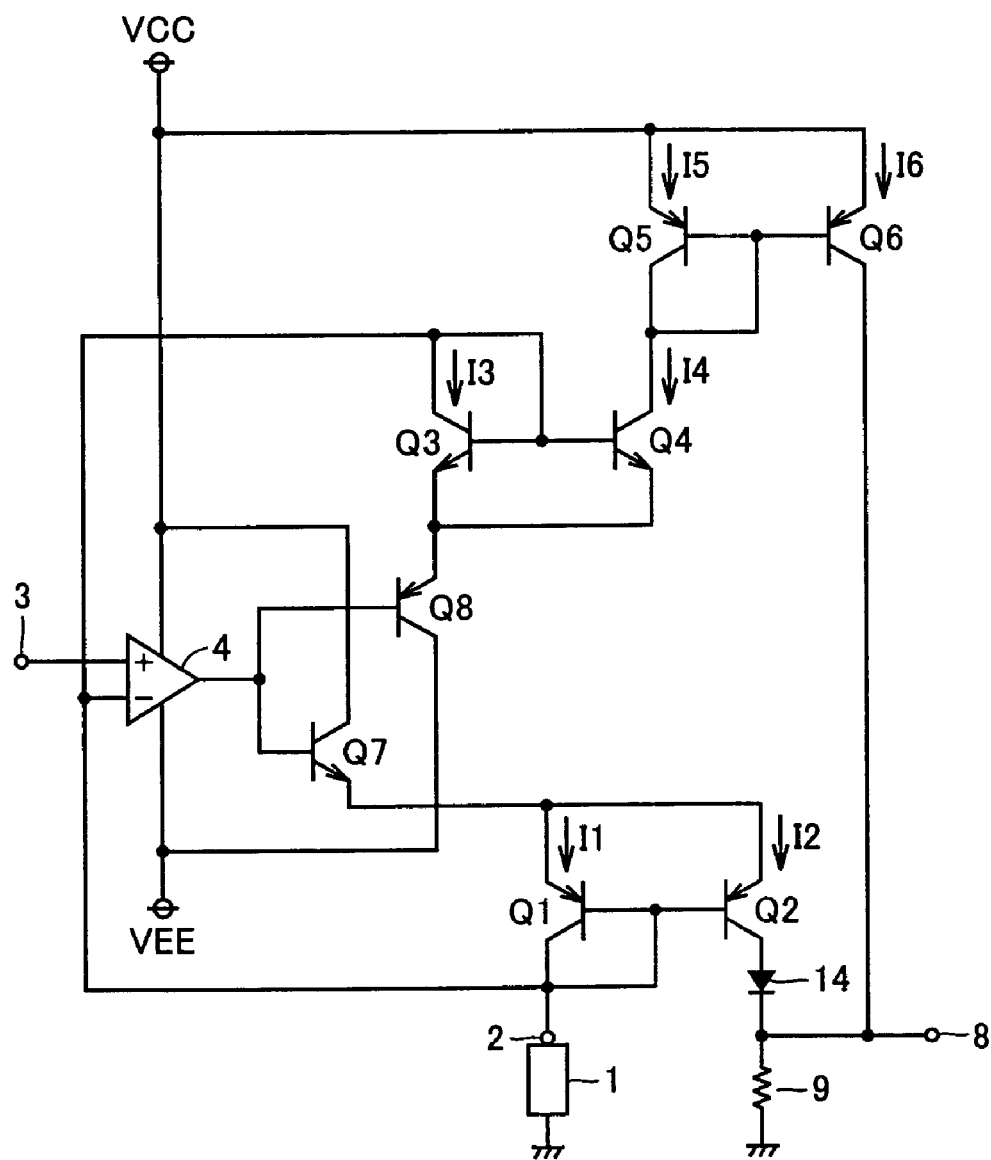

Referring to FIG. 16, the current measuring circuit according to the fourth modification of the sixth embodiment is identical to that of the third modification of the sixth embodiment shown in FIG. 15 except that amperemeter 6 for measuring a sum of absolute values of source and sink currents of load 1 is replaced with a current/voltage converting resistance 9. Description of the common portions is not repeated here.

With this configuration, the sum of the source and sink currents of load 1 measured at amperemeter 6 in FIG. 15 can readily be obtained from the voltage between current measuring terminal 8 and a ground potential and the resistance value of resistance 9. Further, a current waveform can readily be monitored by providing an oscilloscope at current measuring terminal 8.

As described above, according to the sixth embodiment of the present invention, a current of a load can be measured accurately, when the current driving capability of the load is greater than that of the operational amplifier of the current measuring circuit, by enhancing the current driving capability of the operational amplifier with an emitter follower.

Seventh Embodiment

Figure 17:
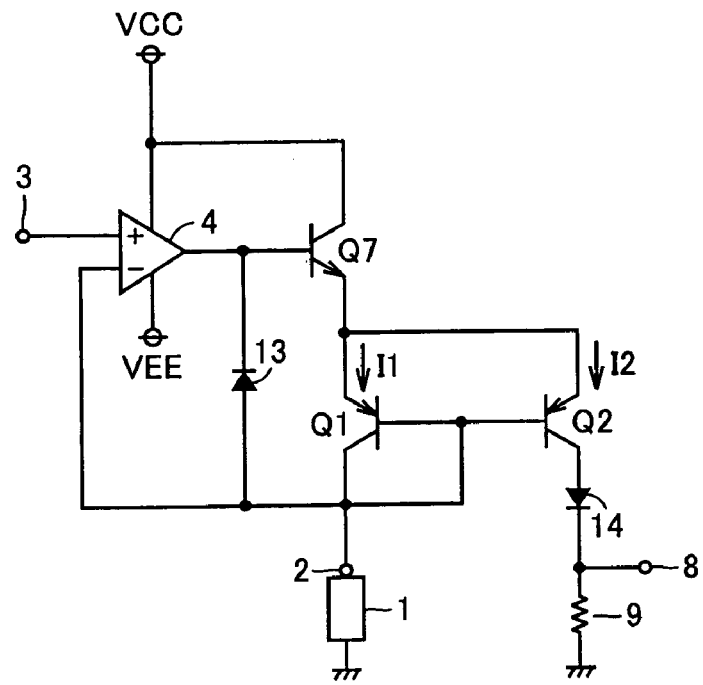
FIG. 17 shows a configuration of the current measuring circuit according to a seventh embodiment of the present invention.

Referring to FIG. 17, the current measuring circuit according to the seventh embodiment of the present invention is identical to that of the sixth embodiment shown in FIG. 12 except that diodes 13, 14 are additionally provided. Description of the common portions is not repeated here.

Diode 13 is connected between the output terminal of operational amplifier 4 and voltage apply terminal 2, and forms a path for the sink current of load 1 to flow to the output terminal of operational amplifier 4. Diode 14 is connected between the emitter of PNP transistor Q2 and current measuring terminal 8, and prevents a current flow in a reverse direction from resistance 9 to PNP transistor Q2. This enables measurement of only the source current of load 1.

Since NPN transistor Q7 serving as the emitter follower is provided as in the sixth embodiment, current-amplified mirror current I2 flows through PNP transistor Q2, and its current value can be obtained from the voltage between current measuring terminal 8 and a ground potential and the resistance value of resistance 9.

As described above, according to the seventh embodiment of the present invention, the source current can be measured accurately even if the current driving capability of load 1 is greater than that of operational amplifier 4, since a mirror current equal to the source current amplified by the emitter follower PNP transistor Q7 flows through resistance 9.

Further, a simple configuration provided with diodes 13, 14 prevents a sink current from flowing through resistance 9, and therefore, it is readily possible to measure only the source current of load 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current measuring circuit measuring a current driven to a load by an applied voltage from a voltage apply terminal, comprising:
   an operational amplifier having a second input terminal connected to said voltage apply terminal for applying a voltage equal to a voltage supplied to a first input terminal to said load;
   a PNP type first transistor electrically coupled between an output terminal of said operational amplifier and said voltage apply terminal; and
   a PNP type second transistor electrically coupled between the output terminal of said operational amplifier and a current measuring terminal and constituting a current mirror with said PNP type first transistor;
   said PNP type first and second transistors having their bases connected to said second input terminal of said operational amplifier and to said voltage apply terminal and, when activated in response to said applied voltage, said PNP type first transistor driving a current to said load via said voltage apply terminal, and
   said PNP type second transistor driving a mirror current of the drive current of said PNP type first transistor to said current measuring terminal.

2. The current measuring circuit according to claim 1, further comprising:
   a first diode element having a first diode anode connected to said voltage apply terminal and a first diode cathode connected to the output terminal of said operational amplifier; and
   a second diode element having a second diode cathode connected to said current measuring terminal and a second diode anode connected to said PNP type second transistor.

3. The current measuring circuit according to claim 1, further comprising resistances connected between the output terminal of said operational amplifier and emitters of said PNP type first and second transistors, respectively,
   wherein voltage drops at said resistances are greater than base-emitter voltages of said PNP type first and second transistors.

4. The current measuring circuit according to claim 1, further comprising an emitter follower electrically coupled between an external power supply terminal and said PNP type first and second transistors and having an emitter follower base connected to the output terminal of said operational amplifier.

5. The current measuring circuit according to claim 1, further comprising one of a resistance and an amperemeter connected between said current measuring terminal and a ground potential.

6. A current measuring circuit measuring a current driven to a load by an applied voltage from a voltage apply terminal, comprising:
   an operational amplifier for applying a voltage equal to a voltage supplied to a first input terminal to said load from a second input terminal via said voltage apply terminal;
   a PNP type first transistor electrically coupled between an output terminal of said operational amplifier and said voltage apply terminal;
   a PNP type second transistor electrically coupled between the output terminal of said operational amplifier and a first current measuring terminal and constituting a current mirror with said PNP type first transistor;
   an NPN type first transistor electrically coupled between the output terminal of said operational amplifier and said voltage apply terminal; and
   an NPN type second transistor electrically coupled between the output terminal of said operational amplifier and a second current measuring terminal and constituting a current mirror with said NPN type first transistor;
   said PNP type first and second transistors and said NPN type first and second transistors having their bases connected to said second input terminal of said operational amplifier and to said voltage apply terminal,
   said PNP type first transistor, when activated in response to said applied voltage of a first voltage level, driving a current to said load via said voltage apply terminal,
   said PNP type second transistor driving a mirror current of the drive current of said PNP type first transistor to said first current measuring terminal,
   said NPN type first transistor, when activated in response to said applied voltage of a second voltage level, driving a current to said load via said voltage apply terminal, and
   said NPN type second transistor driving a mirror current of the drive current of said NPN type first transistor to said second current measuring terminal.

7. The current measuring circuit according to claim 6, further comprising:
   a first resistance connected between said first current measuring terminal and a ground potential;
   a second resistance connected between said second current measuring terminal and a ground potential;
   a PNP type third transistor electrically coupled between a collector of said NPN type second transistor and an external power supply terminal; and
   a PNP type fourth transistor electrically coupled between said second current measuring terminal and said external power supply terminal and constituting a current mirror with said PNP type third transistor;
   said NPN type first transistor, when activated in response to said applied voltage of the second voltage level, driving a current to said load via said voltage apply terminal,
   said NPN type second transistor driving a mirror current of the drive current of said NPN type first transistor to said PNP type third transistor, and
   said PNP type fourth transistor driving a mirror current of the drive current of said PNP type third transistor to said second current measuring terminal.

8. The current measuring circuit according to claim 6, wherein said second current measuring terminal is coupled to said first current measuring terminal,
   the current measuring circuit further comprising:
   a PNP type third transistor electrically coupled between a collector of said NPN type second transistor and an external power supply terminal; and
   a PNP type fourth transistor electrically coupled between said second current measuring terminal and said external power supply terminal and constituting a current mirror with said PNP type third transistor;
   said PNP type first transistor, when activated in response to said applied voltage of the first voltage level, driving a current to said load via said voltage apply terminal,
   said PNP type second transistor driving a mirror current of the drive current of said PNP type first transistor to said first current measuring terminal,
   said NPN type first transistor, when activated in response to said applied voltage of the second voltage level, driving a current to said load via said voltage apply terminal,
   said NPN type second transistor driving a mirror current of the drive current of said NPN type first transistor to said PNP type third transistor, and
   said PNP type fourth transistor driving a mirror current of the drive current of said PNP type third transistor to said first current measuring terminal.

9. The current measuring circuit according to claim 8, further comprising one of a resistance and an amperemeter connected between said first current measuring terminal and a ground potential.

10. The current measuring circuit according to claim 6, further comprising:
   a first emitter follower electrically coupled between said external power supply terminal and said PNP type first and second transistors and having a first emitter follower base connected to the output terminal of said operational amplifier; and
   a second emitter follower electrically coupled between a ground potential and said NPN type first and second transistors and having a second emitter follower base connected to the output terminal of said operational amplifier.

* * * * *